United States Patent
Khalili et al.

(10) Patent No.: US 10,884,449 B2
(45) Date of Patent: Jan. 5, 2021

(54) WIDEBAND LO SIGNAL GENERATION

(71) Applicant: QUALCOMM Incorporated, San Diego, CA (US)

(72) Inventors: Alireza Khalili, Sunnyvale, CA (US); Mohammad Emadi, San Jose, CA (US); Shahram Abdollahi-Alibeik, Los Gatos, CA (US); Ali Mostajeran, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/404,032

(22) Filed: May 6, 2019

(65) Prior Publication Data
US 2020/0356133 A1 Nov. 12, 2020

(51) Int. Cl.
| | |
|---|---|
| *G06F 1/08* | (2006.01) |
| *H03B 27/00* | (2006.01) |
| *H03D 7/14* | (2006.01) |
| *H03D 7/16* | (2006.01) |
| *G06K 1/04* | (2006.01) |
| *H03K 21/02* | (2006.01) |
| *H03K 5/01* | (2006.01) |

(52) U.S. Cl.
CPC ............... *G06F 1/08* (2013.01); *G06K 1/04* (2013.01); *H03B 27/00* (2013.01); *H03D 7/1475* (2013.01); *H03D 7/168* (2013.01); *H03K 5/01* (2013.01); *H03K 21/026* (2013.01); *H03D 2200/0084* (2013.01)

(58) Field of Classification Search
CPC .......... H03K 21/026; H03K 5/01; G06K 1/04; G06F 1/08; H03D 7/168; H03D 7/1475; H03B 27/00
USPC ............. 331/74, 167; 455/260, 182.3, 176.1, 455/180.3; 375/376
See application file for complete search history.

(56) References Cited

U.S. PATENT DOCUMENTS

| | | | |
|---|---|---|---|
| 9,529,380 B1 * | 12/2016 | Rong | H03D 7/18 |
| 2001/0007151 A1 * | 7/2001 | Vorenkamp | H01L 27/0248 |
| | | | 725/151 |
| 2007/0085617 A1 * | 4/2007 | Salerno | H03B 5/1256 |
| | | | 331/167 |

* cited by examiner

*Primary Examiner* — Arnold M Kinkead
(74) *Attorney, Agent, or Firm* — Qualcomm Incorporated

(57) ABSTRACT

An LO clock signal generator includes a fundamental mixer for mixing a source clock signal with a divided version of the source clock signal. The LO clock signal generator also includes a harmonic mixer for mixing the source clock signal with a third harmonic of a divided version of the source clock signal.

22 Claims, 4 Drawing Sheets

WIDEBAND LO SIGNAL GENERATION

TECHNICAL FIELD

This application relates to local oscillator clock signal generation, and more particularly to a local oscillator clock signal generation for covering a wide frequency band.

BACKGROUND

Recent developments for WiFi communication such as specified by the Institute of Electrical and Electronic Engineers (IEEE) standards require WiFi-capable devices such as cellular telephones to have multi-band WiFi communication capability. For example, communication in compliance with the IEEE 802.11a standard uses a 5 GHz band that extends up to nearly 6 GHz whereas as the newer IEEE 802.11ax standard uses a 6 GHz band that extends up to 7 GHz. Backward compatibility with the older WiFi standards is generally required such that a mobile device manufacturer needs an RF frontend that can transmit and receive across a relatively wide range of frequencies.

To generate the RF signal for a given frequency band, the RF frontend uses a local oscillator (LO) clock signal typically generated by a voltage-controlled oscillator (VCO) in a phase-locked loop. A VCO has a limited tuning range such as approximately 20%. But a mobile device that is configured for the IEEE 802.11ax standard needs a wider tuning range to be able to transmit an RF signal across a wideband that extends from 5 GHz to 7 GHz, which represents a 40% tuning range. A single VCO cannot be tuned across such a wide range and still satisfy desired phase noise margins. One approach to satisfy such a wide tuning range would be to use two VCOs: one that is tuned for the 5 GHz band and another that is tuned for the 6 GHz band. But the use of two separate VCOs leads to a significant increase in die space, design layout complexity, and cost. Conventional approaches with a single VCO to cover such a wide tuning range suffer from prohibitively large in-band or out-of-band emissions and poor phase noise performance.

Accordingly, there is a need in the art for improved wideband LO clock signal generation.

SUMMARY

An LO clock signal generator is provided that includes a tunable clock source such as a voltage-controlled oscillator for sourcing a source clock signal. A first divider divides the source clock signal in frequency into a divided source clock signal. A fundamental mixer mixes the source clock signal with the divided source clock signal to form a first up-converted clock signal. An LO distribution network divides the first up-converted clock signal in frequency to form a first LO output clock signal.

The LO clock signal generator also includes a harmonic mixer that mixes the source clock signal with a third harmonic of the divided source clock signal to form a second up-converted clock signal. A second divider divides the second up-converted clock signal to form a third up-converted clock signal. The LO distribution network divides the third up-converted clock signal in frequency to form a second LO output clock signal.

The division by the first divider may be a divide-by-two division such that a frequency for the divided source clock signal is one-half frequency of the source clock signal. The first up-converted clock signal would then have a frequency that is 3/2 times greater than the frequency of the source clock signal. The frequency for the second and third up-converted clock signals would then be 5/2 times greater than the frequency of the source clock signal. If the second divider is also a divide-by-two divider, the frequency for the third up-converted clock signal is then 5/4 times greater than the frequency of the source clock signal. In this fashion, a wide tuning range is obtained for the first and second LO output clock signals despite the use of a single clock source.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To address the need in the art for improved wideband LO clock signal generation, an LO clock signal generator is provided with two modes of operation. In a first mode of operation, a fundamental mixer mixes a source clock signal with a divided source clock signal from a clock divider to produce a first up-converted clock signal that is then used to generate a first LO output clock signal. In a second mode of operation, a harmonic mixer mixes the source clock signal with a third harmonic of the divided source clock signal to produce a second LO output clock signal. As known in the mixer arts, whether a mixer functions as a fundamental mixer or a harmonic mixer depends upon the tuning of loads within the mixer as will be further explained herein. In addition, the following discussion will assume that the clock divider is a divide-by-two clock divider, but it will be appreciated that other division ratios may be used.

Since the clock divider is a divide-by-two clock divider, the first up-converted clock signal has a frequency that is 1.5 times greater than a frequency of the source clock signal whereas the second up-converted clock signal has a frequency that is 2.5 times greater than the frequency of the source clock signal. An additional divide-by-two clock divider divides the second up-converted clock signal into a third up-converted clock signal having a frequency that is 1.25 times greater than the frequency of the source clock signal. An LO distribution network divides the first up-converted clock signal to form the first LO output clock signal. The first LO output clock signal thus has a frequency that is three-fourths of the frequency for the source clock signal. Similarly, the LO distribution network divides the third up-converted clock signal to form the second LO output clock signal. The second LO output clock signal thus has a frequency that is five-eighths of the frequency for the source clock signal. There is thus a 20% frequency difference between the second LO output clock signal and the first LO output clock signal for any giving tuning of the clock source.

A VCO such as within a PLL may produce the source clock signal. A VCO may readily have a 20% tuning range such that the frequency of the source clock signal may be tuned by 20% across the tuning range of the VCO. This tuning range plus the frequency difference between the first LO clock signal and the second LO clock signal allows the VCO to tune a combination of the first LO output clock signal and the second LO output clock signal across a 40% tuning range that extends from a highest-tuned frequency for the first LO output clock signal to a lowest-tuned frequency for the second LO output clock signal. The resulting LO clock signal generator may thus readily satisfy the wide tuning range demanded by such modern communication standards such as IEEE 802.11ax.

Figure 1:
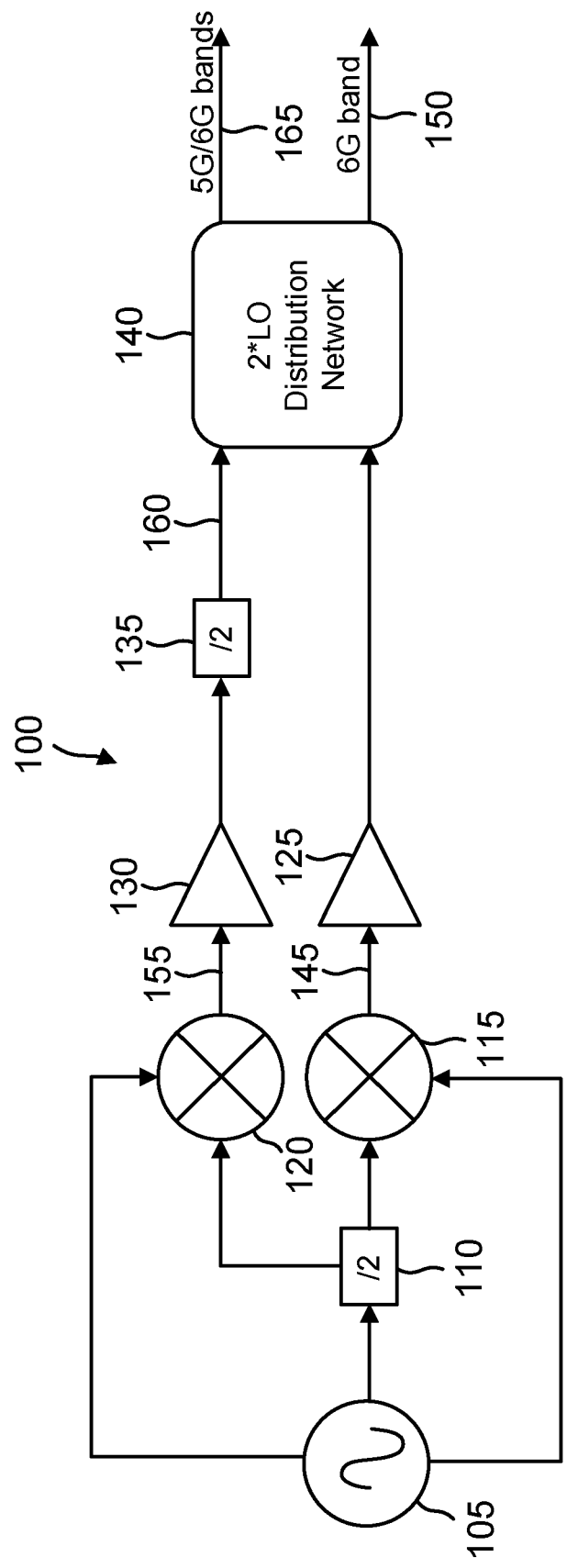
FIG. 1 illustrates an LO clock signal generator in accordance with an aspect of the disclosure.

An example LO clock signal generator 100 is shown in FIG. 1 that includes a clock source 105. Clock source 105 generates a single-ended source clock signal in Figure but it will be appreciated that the LO clock signal generation disclosed herein may be either single-ended or differential. A divide-by-two divider 110 divides a source clock signal from the clock source 105 into a divided source clock signal that is mixed with the source clock signal in a fundamental mixer 115 to produce a first up-converted clock signal 145. Fundamental mixer 115 is also denoted herein as a first mixer 115. A first amplifier 125 amplifies first up-converted clock signal 145 to drive an LO distribution network 140 that divides an amplified version of up-converted clock signal 145 by two in frequency to produce a first LO output clock signal 150. The source clock signal has a frequency represented by a variable f in the following discussion. First up-converted clock signal 145 will thus have a frequency that equals f +1/2f, which equals 1.5*f After the division in LO distribution network 140, a frequency for first LO output clock signal 150 thus equals three-fourths of f (0.75f).

A harmonic mixer 120 is tuned to mix the source clock signal with a third harmonic of the divided source clock signal to form a second up-converted clock signal 155 having a frequency equaling f+3/2*f, which equals 5/2*f. Harmonic mixer 120 is also denoted herein as a second mixer 120. A second amplifier 130 amplifies second up-converted clock signal 155 to drive a divide-by-two divider 135 that divides second up-converted clock signal 155 to form a third up-converted clock signal 160. Due to the divide-by-two division, third up-converted clock signal 160 has a frequency equaling one-half of (5/2*f), which equals 5/4*f. LO distribution network 140 divides third up-converted clock signal 160 in frequency by two to form a second LO output clocks signal 165. A frequency for second LO output clock signal 165 thus equals one-half of the frequency for third up-converted clock signal 160 so that the frequency for second LO output clock signal 165 equals one-half of (5/4*f), which equals five-eighths of f(5/8*f).

Figure 2:
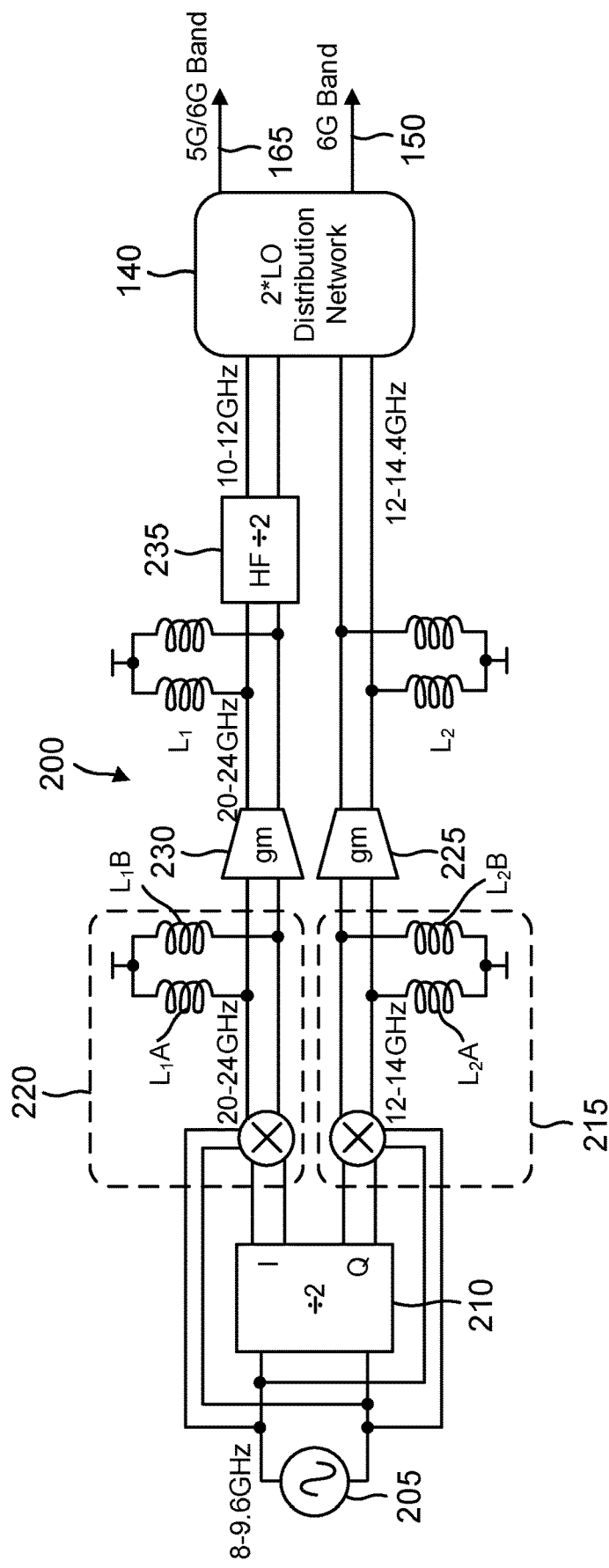
FIG. 2 illustrates the LO clock signal generator of FIG. 1 in which the mixers are Gilbert cell mixers in accordance with an aspect of the disclosure.

As known in the RF signaling arts, a Gilbert cell has both an advantageously high conversion gain and an advantageously high port-to-port isolation. The following discussion will thus assume that mixers 115 and 120 are implemented as Gilbert cell mixers having inductive loads. The following discussion will provide specific frequencies for the various clock signals, but it will be appreciated that such frequencies are illustrative only and may be varied in alternative embodiments. An example LO clock signal generator 200 with inductive loads is shown in FIG. 2. A clock source 205 is a VCO that can tune a differential source clock signal across a tuning range of 8 GHz to 9.6 GHz. The tuning range for VCO 205 is thus a conventional twenty percent tuning range but it will also be appreciated that this tuning range is merely illustrative and may be varied in alternative embodiments. In LO clock signal generator 200, divider 110 is a divide-by-two I/Q divider 210. The divided clock signal thus comprises an in-phase divided clock signal (I) and a quadrature-phase divided clock signal (Q). However, it will be appreciated that there needs to be no quadrature relationship between the divided LO clock signals such that a single differential-output clock divider could replace I/Q divider 210 in alternative embodiments. The I and Q phase relationship between the divided clock signals is arbitrary since only one divided LO clock signal is used depending upon the mode of operation. A Gilbert cell harmonic mixer 220 has inductive loads formed by a pair of first load inductors $L_1$ formed by a load inductor $L_1A$ and a load inductor $L_1B$ that are tuned so that harmonic mixer 220 mixes and amplifies the components coming from the mixing of the third harmonic of the I-phase differential clock signal with the differential source clock signal to produce a differential second up-converted clock signal. Each load inductor $L_1A$ and $L_1B$ couples between a corresponding output node of Gilbert cell harmonic mixer 220 and a power supply node for a power supply voltage.

Since a frequency for the differential second up-converted clock signal is 5/2 times the frequency for the differential source clock signal, the frequency of the differential second up-converted clock signal ranges from 20 GHz to 24 GHz as the differential source clock signal is tuned across its tuning range. A transconductance amplifier 230 amplifies the differential second up-converted clock signal. A pair of third load inductors $L_1$ couples between the power supply node and respective output ports of transconductance amplifier 230 to provide additional filtering for the amplified differential second up-converted clock signal. Although transconductance amplifier 230 includes this second pair of inductors $L_2$, they are shown separately in FIG. 2 for illustration clarity. A divide-by-two divider 235 divides the differential second up-converted clock signal as amplified by transconductance amplifier 230 into a differential third up-converted clock signal that ranges in frequency from 10 to 12 GHz depending upon the tuning for VCO clock source 205. The divide-by-two in frequency in LO distribution network 140 then forces second LO output clock signal 165 to range in frequency from 5 GHz to 6 GHz depending upon the tuning for VCO clock source 205.

Fundamental mixer 115 is implemented as a Gilbert cell fundamental mixer 215 having an inductive load formed by a pair of second load inductors $L_2$ formed by a load inductor $L_2A$ and a load inductor $L_2B$. The inductance of the pair of second load inductors $L_2$ cause Gilbert cell fundamental mixer 215 to mix the Q-phase differential clock signal with the differential source clock signal to produce a differential first up-converted clock signal that ranges in frequency from 12 to 14.4 GHz depending upon the tuning in VCO clock source 205. Each inductor $L_2A$ and $L_2B$ couples between its respective output port for Gilbert cell fundamental mixer 215 and the power supply node. A transconductance amplifier 225 amplifies the differential first up-converted clock signal. A pair of fourth inductors $L_2$ couples between the power supply node and respective output ports of transconductance amplifier 225 to provide additional filtering for the amplified differential second up-converted clock signal. This second pair of inductors $L_2$ is part of transconductance amplifier 225 but are shown separately in FIG. 2 for illustration clarity. After the divide-by-two in frequency by LO distribution network 140, first LO output clock signal 150 ranges in frequency from 6 GHz to 7.2 GHz depending upon the tuning in VCO clock source 205.

Figure 3:
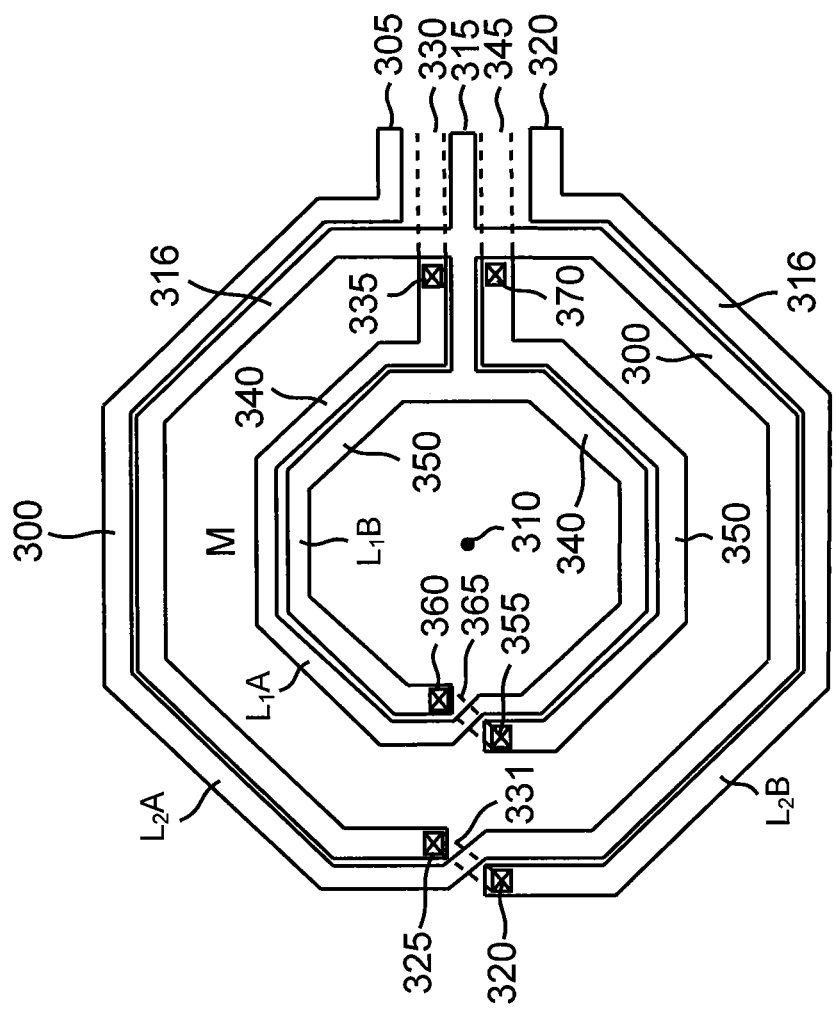
FIG. 3 illustrates two adjacent metal layers patterned to form the inductive loads for the Gilbert cell mixers of FIG. 2 in accordance with an aspect of the disclosure.

Both pairs of inductors $L_1$ and $L_2$ may be advantageously formed in the same two metal layers as shown in FIG. 3. With regard to these metal layers, it will be appreciated that the active device forming the remaining components in LO clock signal generators 100 and 200 are implemented in a semiconductor substrate. As known in the semiconductor arts, the signals to active devices such as transistors formed in the semiconductor substrate are conducted in patterned metal layers adjacent to the semiconductor substrate. A first metal layer would thus be immediately adjacent the semiconductor substrate. Successive metal layers would then be stacked on the first metal layer until a final metal layer is reached. Each metal layer is insulated by dielectric and is patterned as necessary to route the desired signals as well as power and ground to the active devices. In FIG. 3, a metal layer M shown in plan view is patterned into a first loop 300 to form load inductor $L_2A$. First loop 300 extends from an input 305 to substantially encircle about a central axis 310. First loop 300 connects to a power supply lead 315 that is tied to the power supply voltage node for a power supply voltage VDD. The same metal layer M is also patterned into a second loop 316 having a first portion that extends from an input 320 to also substantially encircle about central axis 310. This first portion of second loop 316 is outside of first loop 300 but crosses to the inside of first loop 300 through a via 320 to couple through a relatively-short connecting lead 331 in an adjacent metal layer to re-emerge through a via 325 onto metal layer M to connect to a second portion of second loop 316 that lies within first loop 300. This second portion of second loop 316 ends by coupling to power supply lead 315. The two portions of second loop 316 form load inductor $L_2B$ (note that is arbitrary as to which inductor $L_2$ is denoted as being $L_2A$ or $L_2B$). A signal propagating through first loop 300 from input 300 travels counterclockwise whereas second loop 316 has a clockwise orientation. Given the two different orientations, first loop 300 thus couples to a first side of power supply lead 315 whereas second loop 316 couples to an opposite side of power supply lead 315. The inductance for load inductors $L_2A$ and $L_2B$ depends upon several factors including the enclosed area about central axis 310. To increase the inductance, additional pairs of adjacent metal layers may be used to form additional loops for inductors $L_2$. Each additional pair of adjacent metal layers could be patterned as shown in FIG. 3 to couple to common inputs 305 and 315.

To advantageously reduce the metal layer space needed to form the inductors, inductors $L_1$ may be formed about central axis 310 within the area enclosed by inductors $L_2$. A third loop 340 that forms inductor $L_1A$ is essentially a smaller copy of first loop 300. However, to prevent shorting between the inductors, an input 330 to third loop 340 is formed in the adjacent metal layer. Input 330 couples to a via 335 to emerge onto metal layer M as third loop 340 that substantially encircles central axis 310 to tie to power supply lead 315. Similarly, a fourth loop 350 that forms inductor $L_1B$ is essentially a copy of second loop 316 but begins at an input 345 in the adjacent metal layer and couples through a via 370 to emerge onto metal layer M to substantially encircles about central axis 310. To prevent shorting between the $L_1$ inductors, a first portion of fourth loop 350 connects to a via 355 to couple though a relatively-short lead 365 in the adjacent metal layer to re-emerge onto metal layer M through a via 360 to connect to a final portion of fourth loop 350 to end at power supply lead 315. Third loop 340 and fourth loop 350 are thus concentric with first loop 300 and second loop 316.

Since the frequency for fundamental mixer 215 is lower as compared to harmonic mixer 220, the radius or enclosed area for third loop 340 and fourth loop 350 forming inductors $L_1$ is less than the radius or enclosed area for first loop 300 and second loop 316 forming inductors $L_2$. Note that no additional metal layer space needs to be dedicated to form inductors $L_1$ since they reside within inductors $L_2$. Referring again to LO clock signal generator 200, note that there are two pairs of inductors $L_1$ and also two pairs of inductors $L_2$. The metal layer arrangement of FIG. 3 may thus be repeated to construct the resulting eight inductors, which increases advantageously increases density. Moreover, no coupling between inductors $L_1$ and $L_2$ affects performance since first LO output clock signal 165 and second LO output clock signal 150 are not generated simultaneously but are instead confined to their respective modes of operation.

In one embodiment, fundamental mixer 115 or 215 may be deemed to form a first means for frequency shifting a source clock signal into a first up-converted clock signal having a frequency that is one and one-half times larger than a source frequency for the source clock signal. Similarly, harmonic mixer 120 or 220 may be deemed to form a second means for frequency shifting the source clock signal into a second up-converted clock signal having a frequency that is two and one-half times larger than the source frequency.

Figure 4:
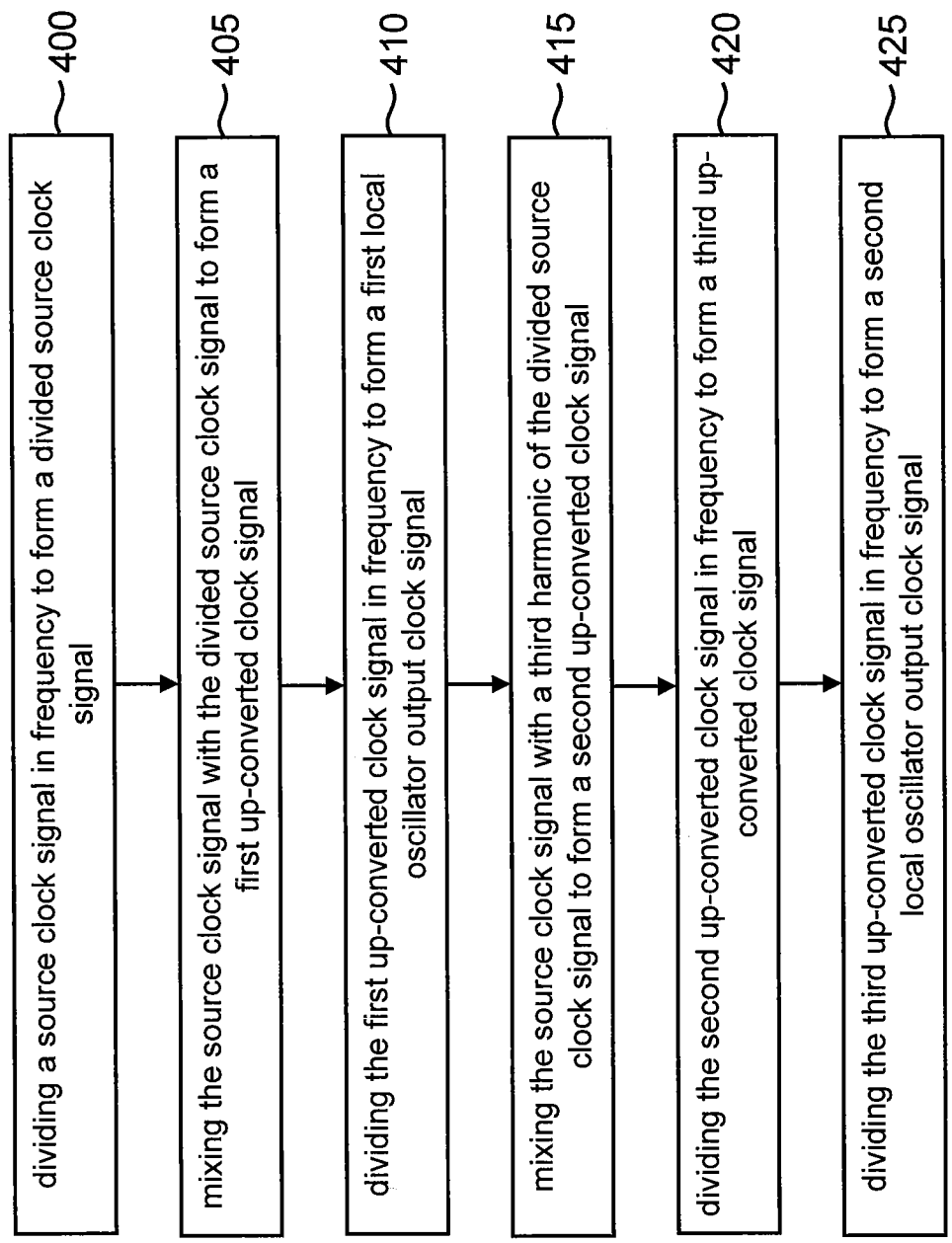
FIG. 4 is a flowchart for an LO clock signal generation method in accordance with an aspect of the disclosure.

A method of operation for an LO signal generator will now be discussed. The method covers two modes of operation. In a first mode of operation, the first LO output clock signal is generated whereas in a second mode of operation, the second LO output clock signal is generated. The method during the first mode of operation includes acts 400 through 410 as shown in the flowchart of FIG. 4. Act 400 includes dividing a source clock signal in frequency to form a divided source clock signal. The division in divider 110 or divider 210 is an example of act 400. An act 405 includes mixing the first clock signal with the divided source clock signal to form a first up-converted clock signal. The mixing in fundamental mixers 115 and 215 is an example of act 405. The first mode of operation finally includes an act 410 of dividing the first up-converted clock signal in frequency to form a first local oscillator output clock signal. The division in LO distribution network 140 is an example of act 410.

The second mode of operation begins with an act 415 of mixing the source clock signal with a third harmonic of the divided source clock signal to form a second up-converted clock signal. The mixing in harmonic mixers 120 and 220 is an example of act 415. In addition, the second mode of operation includes an act 420 of dividing the second up-converted clock signal in frequency to form a third up-converted clock signal. The division in divider 135 is an example of act 420. Finally, the second mode of operation includes an act 425 of dividing the third up-converted clock signal in frequency to form a second local oscillator output clock signal. The division in local oscillator network 140 is an example of act 425.

It will be appreciated that many modifications, substitutions and variations can be made in and to the materials, apparatus, configurations, frequency division ratios, and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A local oscillator (LO) clock signal generator, comprising:
   a clock source for sourcing a source clock signal;
   a first divider configured to divide the source clock signal in frequency into a divided source clock signal;
   a first mixer configured to mix the source clock signal with the divided source clock signal to form a first up-converted clock signal;
   a second mixer configured to mix the source clock signal with a third harmonic of the divided source clock signal to form a second up-converted clock signal;
   a second divider configured to divide the second up-converted clock signal in frequency to form a third up-converted clock signal; and
   an LO distribution network configured to divide the first up-converted clock signal in frequency to form a first LO output clock signal and to divide the third up-converted clock signal in frequency to form a second LO output clock signal.

2. The LO clock signal generator of claim 1, wherein the first divider is an in-phase/quadrature-phase (I/Q) divider configured to divide the source clock signal by two to form an in-phase divided clock signal and a quadrature-phase divided clock signal, and wherein first mixer is further configured to mix the source clock signal with the in-phase divided clock signal to form the first up-converted clock signal, and wherein the second mixer is further configured to mix the source clock signal with the quadrature-phase divided clock signal to form the second up-converted clock signal.

3. The LO clock signal generator of claim 1, wherein the clock source is a voltage-controlled oscillator.

4. The LO clock signal generator of claim 1, wherein the first divider is a divide-by-two divider.

5. The LO clock signal generator of claim 4, wherein the clock source is a differential clock source.

6. The LO clock signal generator of claim 5, wherein the first mixer includes a pair of first load inductors coupled between a pair of output nodes for the first mixer and a power supply node, and wherein the second mixer includes a pair of second load inductors coupled between a pair of output nodes for the second mixer and the power supply node.

7. The LO clock signal generator of claim 6, wherein the first pair of load inductors comprises a first loop in a first metal layer and a second loop in the first metal layer, wherein the second loop includes a first portion outside of the first loop and includes a second portion inside the first loop, and wherein the first portion of the second loop connects to the second portion of the second loop through a connecting lead in an adjacent metal layer to the first metal layer.

8. The LO clock signal generator of claim 7, wherein the pair of second load inductors comprises a third loop in the first metal layer and a fourth loop in the first metal layer, and wherein the third loop and the fourth loop are both concentric with the first loop and the second loop.

9. The LO clock signal generator of claim 8, wherein the third loop and the fourth loop are both within the first loop and the second loop.

10. The LO clock signal generator of claim 1, wherein the second divider is a divide-by-two clock divider.

11. The LO clock signal generator of claim 10, wherein the LO distribution network is configured divide the first up-converted clock signal by two to form the first LO output clock signal and to divide the third up-converted clock signal by two to form the second LO output clock signal.

12. The LO clock signal generator of claim 1, further comprising:
   a first amplifier for amplifying the first up-converted clock signal, and
   a second amplifier for amplifying the second up-converted clock signal.

13. The LO clock signal generator of claim 12, wherein the first amplifier is a first transconductance amplifier including a first pair of load inductors, and wherein the second amplifier is a second transconductance amplifier including a second pair of load inductors.

14. An LO clock signal generation method, comprising:
   during a first mode of operation:
      dividing a source clock signal in frequency to form a divided source clock signal;
      mixing the source clock signal with the divided source clock signal to form a first up-converted clock signal; and
      dividing the first up-converted clock signal in frequency to form a first local oscillator output clock signal;
   during a second mode of operation:
      mixing the source clock signal with a third harmonic of the divided source clock signal to form a second up-converted clock signal;
      dividing the second up-converted clock signal in frequency to form a third up-converted clock signal; and
      dividing the third up-converted clock signal in frequency to form a second local oscillator output clock signal.

15. The method of claim 14, wherein dividing the source clock signal to form the divided source clock signal comprises dividing the source clock signal in frequency by two.

16. The method of claim 15, wherein dividing the first up-converted clock signal in frequency to form the first local oscillator output clock signal comprises dividing the first up-converted clock signal in frequency by two.

17. The method of claim 15, wherein dividing the second up-converted clock signal in frequency to form a third up-converted clock signal comprises dividing the second-up converted clock signal in frequency by two.

18. The method of claim 17, wherein dividing the third up-converted clock signal in frequency to form the second local oscillator output clock signal comprising dividing the third up-converted clock signal in frequency by two.

19. The method of claim 14, further comprising:
   amplifying the first up-converted clock signal prior to the dividing of the first up-converted clock signal in frequency to form the first local oscillator output clock signal; and
   amplifying the second up-converted clock signal prior to the dividing of the second up-converted clock signal in frequency to form the third up-converted clock signal.

20. An LO clock signal generator, comprising:
   first means for frequency shifting a source clock signal into a first up-converted clock signal having a frequency that is one and one-half times larger than a source frequency for the source clock signal;
   second means for frequency shifting the source clock signal into a second up-converted clock signal having a frequency that is two and one-half times larger than the source frequency;

a divide-by-two divider configured to divide the second up-converted clock signal into a third up-converted clock signal having a frequency that is one and one-fourth times larger than the source frequency; and
   an LO distribution network configured to divide the first up-converted clock signal into a first LO output clock signal having a frequency that is three-fourths of the source frequency, the LO distribution network being further configured to divide the third up-converted clock signal into a second LO output clock signal having a frequency that is five-eighths the source frequency.

21. The LO clock signal generator of claim 20, further comprising a clock source configured to source the source clock signal.

22. The LO clock signal generator of claim 21, wherein the clock source comprises a voltage-controlled oscillator.

* * * * *